United States Patent [19]

Wada et al.

[11] 4,292,549

[45] Sep. 29, 1981

[54] MONOSTABLE MULTIVIBRATOR AND FM DETECTOR CIRCUIT EMPLOYING DIFFERENTIAL TRANSISTOR PAIR (THRESHOLD) TRIGGER CIRCUIT TO AVOID INTERFERENCE SIGNAL OPERATION

[75] Inventors: Takeshi Wada; Masanori Ienaka, both of Kodaira; Yasuo Kominami, Kokubunji; Yukihiko Miyamoto; Tsuneo Yamada, both of Tokyo, all of Japan

[73] Assignees: Hitachi Ltd.; Trio Kabushiki Kaisha, both of Tokyo, Japan

[21] Appl. No.: 3,120

[22] Filed: Jan. 12, 1979

[30] Foreign Application Priority Data

Mar. 15, 1978 [JP] Japan .................. 53-28662

[51] Int. Cl.³ .................... H03K 5/08; H03K 3/033
[52] U.S. Cl. ......................... 307/247 R; 307/273; 307/280; 307/547; 307/315
[58] Field of Search ........... 307/273, 280, 237, 247 R, 307/315

[56] References Cited

U.S. PATENT DOCUMENTS

| | | | |
|---|---|---|---|
| 3,124,706 | 3/1964 | Alexander | 307/273 X |
| 3,140,446 | 7/1964 | Myers et al. | 307/273 X |
| 3,143,658 | 8/1964 | Woods et al. | 307/273 X |
| 3,193,706 | 7/1965 | Creamer et al. | 307/273 X |
| 3,755,693 | 8/1973 | Lee | 307/280 X |
| 3,828,206 | 8/1974 | Zuk | 307/280 X |
| 3,883,756 | 5/1975 | Dragon | 307/273 X |

*Primary Examiner*—John S. Heyman
*Attorney, Agent, or Firm*—Craig & Antonelli

[57] ABSTRACT

A monostable multivibrator circuit including a time constant circuit which includes a capacitor, an amplifier circuit which receives an output signal of the time constant circuit, and a positive feedback circuit which is connected between an output end of the amplifier circuit and an input end of the time constant circuit, characterized in that a trigger circuit is incorporated in a part of a circuit loop which is constructed of the time constant circuit, the amplifier circuit and the positive feedback circuit, the trigger circuit comprising an emitter-follower transistor which receives a feedback signal, another emitter-follower transistor which receives a trigger signal and whose emitter is connected to an emitter of the first-mentioned emitter-follower transistor in common, and a constant-current circuit which supplies a constant current to the emitters connected in common. Thus, the monostable multivibrator circuit can provide a predetermined pulse signal without any interference attributable to a trigger input circuit.

7 Claims, 10 Drawing Figures

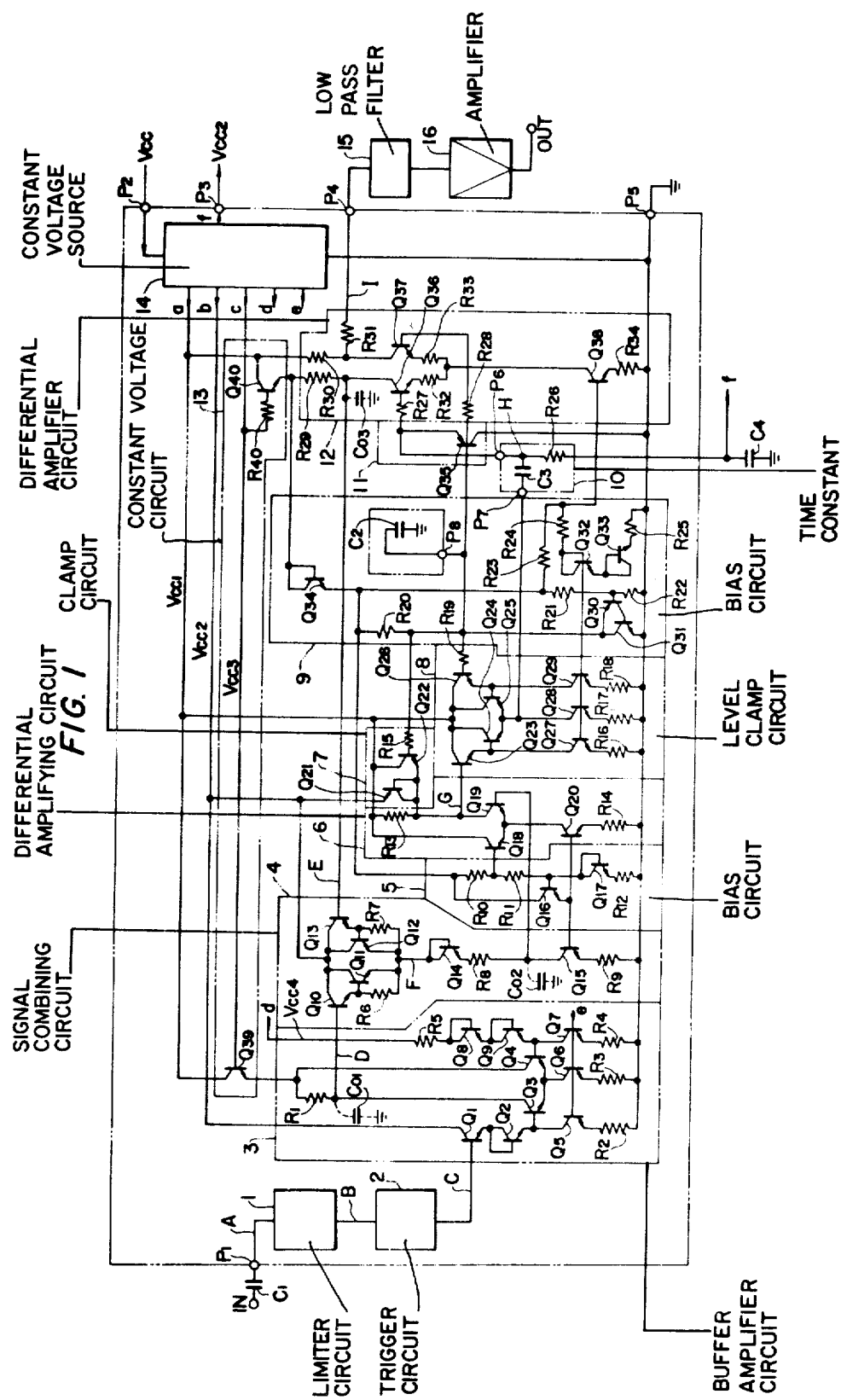

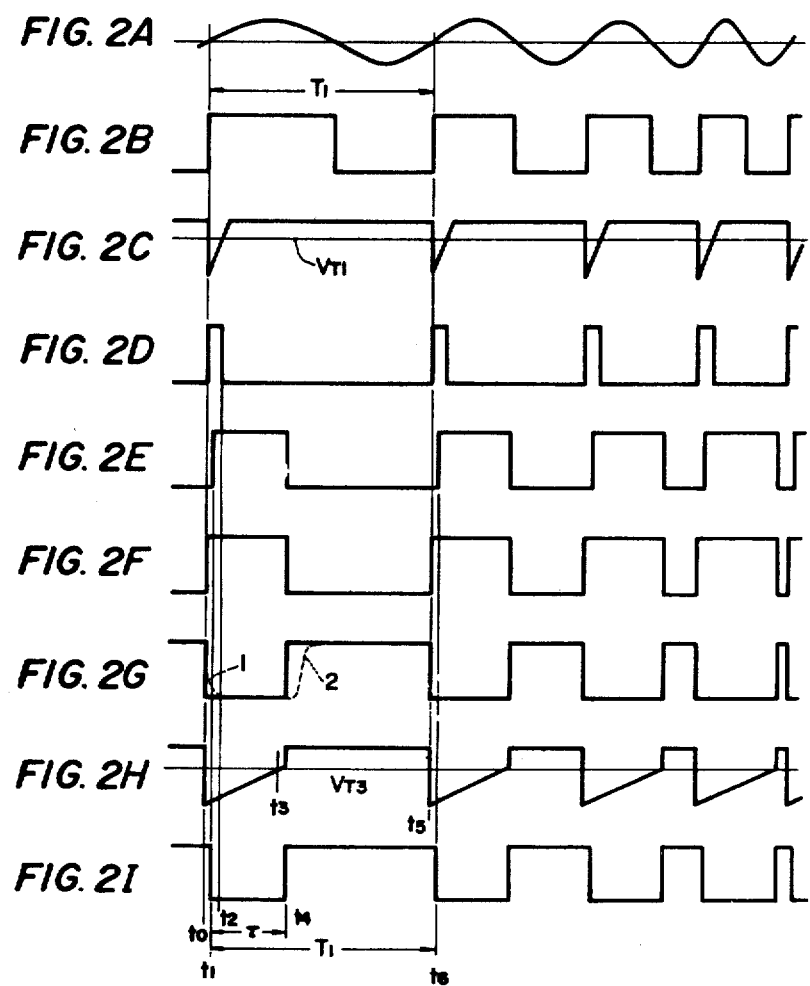

MONOSTABLE MULTIVIBRATOR AND FM DETECTOR CIRCUIT EMPLOYING DIFFERENTIAL TRANSISTOR PAIR (THRESHOLD) TRIGGER CIRCUIT TO AVOID INTERFERENCE SIGNAL OPERATION

BACKGROUND OF THE INVENTION

This invention relates to a monostable multivibrator circuit. More particularly, it relates to a circuit arrangement for applying a trigger signal to a monostable multivibrator circuit of the non-saturated type in which an amplifier transistor operates in a non-saturated state.

A monostable multivibrator circuit usually has a time constant circuit which uses a capacitor, an amplifier circuit which is connected to the output end of the time constant circuit, a positive feedback circuit which is connected between the output end of the amplifier circuit and the input end of the time constant circuit, and a trigger terminal which is disposed in a predetermined portion of the circuit loop.

The monostable multivibrator circuit has its characteristics limited by various causes.

For example, since an electrostatic capacity existing between the trigger terminal and the earth point of the circuit limits the changing rate of the trigger signal, the changing rate of an input signal of the time constant circuit becomes low. As a result, the timing of the rise or fall of an output signal responsive to the trigger signal lags, and the rate of the rise or fall lowers.

Since the trigger terminal is disposed at a part of the circuit loop, undesirable electrical interference takes place between the trigger terminal and any circuit within the loop through the medium of the loop. On account of the interference with the trigger terminal due to the circuit loop, the operation of a trigger signal supplying circuit is adversely affected, or the trigger level varies in case where an operating period differs in repeated operations. Conversely, on account of the interference with the circuits within the loop due to the trigger terminal, the waveform of the output signal is distorted or the pulse width fluctuates, resulting in influences on the circuit operation in some cases.

The output pulse of the monostable multivibrator circuit constants and characteristics thereof. In a case where the trigger period differs, the output pulse comes to have a duty ratio corresponding to the particular period. It has therefore been considered to apply the monostable multivibrator circuit to, e.g., the so-called pulse count detector circuit in which an FM (frequency-modulated) signal is converted into a pulse signal of a duty ratio corresponding to the frequency, and the pulse signal is smoothed thereby to obtain a demodulated signal.

The monostable multivibrator circuit for use in such a pulse count detector circuit needs to operate at high speed and to deliver pulse signals of fixed amplitude and pulse width having a sharp waveform in order that a duty ratio exactly corresponding to the frequency of the FM signal may be given and that the signal level after the smoothing may exactly correspond to the duty ratio.

Heretofore, there has not been a monostable multivibrator which meets these requirements satisfactorily.

SUMMARY OF THE INVENTION

It is accordingly an object of this invention to provide a monostable multivibrator circuit which has a high operating speed.

Another object of this invention is to provide a monostable multivibrator circuit in which a trigger input and a feedback loop interfere little with each other.

Another object of this invention is to provide a monostable multivibrator circuit which is suited to a pulse count detector circuit.

Another object of this invention is to provide a monostable multivibrator circuit which is suitably assembled in, for example, a semiconductor linear integrated circuit.

Further objects of this invention will become apparent from the following description and the accompanying drawings.

In a monostable multivibrator circuit according to this invention, a trigger signal and a feedback signal are respectively received by emitter-follower transistors, and these two signals are combined at the emitters of the emitter-follower transistors. The composite signal is put into a circuit receiving the feedback signal, such as a time constant circuit.

Hereunder, this invention will be described in detail in conjunction with an embodiment with reference to the drawings.

BRIEF DESCRIPTION OF THE DRAWINGS

FIG. 1 is a circuit diagram showing an embodiment in which the monostable multivibrator of this invention is applied to an FM detector circuit of a pulse count system.

FIGS. 2A to 2I are diagrams of operating waveforms in the embodiment of this invention shown in FIG. 1.

DESCRIPTION OF THE PREFERRED EMBODIMENT

FIG. 1 shows a monostable multivibrator circuit of an embodiment in the state in which it is used in a detector circuit of the pulse count system.

Referring to the figure, numeral 1 designates a limiter circuit, numeral 2 a trigger signal forming circuit, numeral 3 a buffer amplifier circuit which executes an amplitude limiting operation, and numeral 4 a signal combining circuit. Numerals 5 and 9 designate bias supplying circuits, and numerals 6 and 12 differential amplifier circuits. Numeral 7 indicates a level clamp circuit, numeral 8 a differentiator driver and level clamp circuit, numeral 10 a time constant circuit, and numeral 11 a differentiator output clamp circuit. Shown at 13 and 14 are constant-voltage circuits.

In the above, the circuits 4 to 12 constitute the monostable multivibrator circuit.

A portion enclosed with a one-dot chain line in the figure is put into a semiconductor integrated circuit (IC). $P_1$ to $P_5$ represent external terminals of the IC.

Signal waveforms at positions A to I in the circuit are respectively illustrated in FIGS. 2A to 2I.

An FM signal which has been broadcast and received and which has been converted into an intermediate frequency of comparatively low frequency is applied to the terminal $P_1$ through a terminal IN as well as a coupling capacitor $C_1$.

This FM signal is waveform-shaped by the limiter circuit 1 in order to obtain a trigger signal later. The limiter circuit 1 amplifies the input FM signal shown in FIG. 2A, and limits the amplitude of the amplified signal. As illustrated in FIG. 2B, the output signal of the limiter circuit 1 becomes a substantially rectangular signal waveform having the same periods as those of the input FM signal.

The trigger signal forming circuit 2 includes, for example, a waveform shaping circuit composed of resistors and capacitors and an amplifier circuit (neither is shown in the figure). In response to the input rectangular wave signal in FIG. 2B, it provides the trigger signal in synchronism with the rise of the input signal. The output signal waveform of the circuit 2 assumes the shape illustrated in FIG. 2C.

The trigger signal is applied to the buffer amplifier circuit 3. In the buffer amplifier circuit 3, transistors $Q_5$ to $Q_7$ operate as constant-current transistors owing to a base bias voltage fed from the constant-voltage circuit 14.

The trigger signal is applied to the base of one differential transistor $Q_3$ through an emitter follower transistor $Q_1$ and a level shifting transistor in the diode connection $Q_2$ which are connected in series. The quantity of level shift by the transistors $Q_1$ and $Q_2$ is constant because their emitter currents are fixed by the transistor $Q_5$.

An output voltage $V_{CC4}$ of the constant-voltage circuit 14 is applied to the base of the other differential transistors $Q_8$ and $Q_9$ which are connected in series.

The base potential $V_{T1}$ of the other differential transistor $Q_4$ is set at an intermediate value in the level variation range of the trigger signal which is applied to the one differential transistor $Q_3$. The one differential transistor $Q_3$ conducts the "on-off" operation with its threshould voltage being the potential $V_{T1}$.

In response to the input trigger signal shown in FIG. 2C, accordingly, the buffer amplifier circuit 3 provides an inverted signal which is waveform-shaped into a fixed amplitude and duration as illustrated in FIG. 2D.

The trigger signal subjected to the waveform shaping and a feedback signal from the differential amplifier circuit 12 are applied to the signal combining circuit 4.

Transistors $Q_{10}$ and $Q_{11}$ and transistors $Q_{12}$ and $Q_{13}$ of the signal combining circuit 4 are Darlington-connected, respectively. The emitters of the transistors $Q_{11}$ and $Q_{12}$ are connected in common, and are connected to the collector of a constant-current transistor $Q_{15}$ through a level shifting transistor in the diode connection $Q_{14}$ and a resistor $R_8$.

The transistors $Q_{10}$ and $Q_{11}$ and those $Q_{13}$ and $Q_{12}$ in the Darlington connections operate as a kind of switching element for two input signals owing to the common connection of the emitters. The potential of the emitters connected in common corresponds to a higher one of the base potentials of the transistors $Q_{10}$ and $Q_{13}$. The transistors in the Darlington connection operate also as a level shift circuit. The Quantity of level shift which occurs between the base and the common emitter of the Darlington-connected transistors in the "on" state is equal to the sum of the base-emitter forward voltages of the two transistors. In this case, the emitter current is made constant by the constant-current transistor $Q_{15}$, and hence, the base-emitter forward voltage is constant. Accordingly, the aforecited quantity of level shift is constant irrespective of the level of the input signal applied to the base of the Darlington-connected transistor.

Here, since an output voltage $V_{CC3}$ of the constant-voltage circuit 14 is lower than another output voltage $V_{CC2}$, the transistors $Q_{10}$ and $Q_{13}$ are not saturated.

In the circuit of FIG. 1, the signal shown in FIG. 2D is applied to the base of the Darlington-connected transistor $Q_{10}$, and the feedback signal shown in FIG. 2E is applied to the base of the transistor $Q_{13}$. Therefore, a composite signal shown in FIG. 2F appears at the common-connection emitters.

The composite signal is applied to the differential amplifier circuit 6 through a level shift circuit which consists of the diode-connected transistor $Q_{14}$ and the resistor $R_8$. The differential amplifier circuit 6 consists of differential transistors $Q_{18}$ and $Q_{19}$, a constant-current transistor $Q_{20}$ and a load resistor $R_{13}$, and it inverts and amplifies the entered composite signal. An output signal at an output terminal of the differential amplifier circuit 6 has its high level and low level limited by the clamp circuit 7. Since, in the clamp circuit 7, the emitter of a transistor $Q_{21}$ is connected to an output terminal b of the constant-voltage circuit 14, the high level is determined by the voltage $V_{CC2}$ and the base-emitter forward voltage of the transistor $Q_{21}$. Since the base of a transistor $Q_{22}$ receives a constant voltage from the bias supplying circuit 9 through a resistor of comparatively small resistance $R_{15}$, the low level is determined by the constant voltage and the base-emitter forward voltage of the transistor $Q_{22}$. The voltage $V_{CC2}$ has a value lower than a supply voltage $V_{CC1}$ of the differential amplifier circuit 6. The low clamp level owing to the transistor $Q_{22}$ is made a comparatively high level lest the collector potential of the differential transistor $Q_{19}$ should become lower than the base potential thereof.

The differential amplifier circuit 6 provides an inverted signal as shown in FIG. 2G at its output terminal in response to the input signal shown in FIG. 2F.

The changing rate of the output signal of the differential amplifier circuit 6 at the rise thereof is limited by the time constant between the load resistor $R_{13}$ and an output capacitance (not shown) including the collector capacitance of the transistor $Q_{19}$, a wiring capacitance, etc. In particular, the changing rate decreases as the potential of the output terminal becomes closer to the supply voltage $V_{CC1}$.

The portion of the low rate of change is removed from the output signal by the clamping of the high level of the output signal.

The differential transistor $Q_{19}$ operates in the nonsaturated state because the lower limit of its collector potential is set by the clamp circuit 7. Accordingly, it operates at a high speed. In contrast, in case where the lower limit of the collector potential is not set, the transistor $Q_{19}$ will operate in the saturated state when the collector potential has become lower than the base potential in response to the input signal. Since the current gain of the transistor becomes small in the saturated state, the output signal waveform will become rounded as indicated by a broken line 1 in FIG. 2G. Besides, it lags as indicated by a broken-line curve 2 in FIG. 2G on account of the accumulation of carriers in the base and the collector.

The output signal of the differential amplifier circuit 6 is applied to the differentiator driver circuit which has emitter-follower transistors $Q_{23}$ and $Q_{24}$ in the Darlington connection. The differentiator driver and level clamp circuit 8 has a clamp circuit which is composed of transistors $Q_{25}$ and $Q_{26}$. The lower-limit level of the emitter potential of the transistor $Q_{24}$ is limited by this clamp circuit.

An output signal from the buffer amplifier circuit 8 is applied through an external terminal $P_7$ to the time constant circuit 10 which is composed of a capacitor $C_3$ and a resistor $R_{26}$. An output signal from the time constant circuit is applied to the differential amplifier circuit 12 through an external terminal $P_6$ as well as the differentiator output clamp circuit 11.

One end of the resistor $R_{26}$ of the time constant circuit 10 is connected to a smoothing capacitor $C_4$ and an output terminal f of the constant-voltage circuit 14. In the stable state of the monostable multivibrator circuit, the base-emitter path of a p-n-p transistor $Q_{35}$ of the differentiator output clamp circuit 11 is forwardbiased by a current from the resistor $R_{26}$. Accordingly, the emitter potential of the transistor $Q_{35}$ is higher than the base potential thereof. Owing to the aforecited potentials of the differentiator output clamp circuit 11, a transistor $Q_{36}$ of the differential amplifier circuit 12 is in the "on" state and a transistor $Q_{37}$ thereof is in the "off" state.

The time constant circuit 10 provides a signal shown in FIG. 2H.

The differential amplifier circuit 12 is made up of the differential amplifier transistor $Q_{36}$ and $Q_{37}$, load resistors $R_{29}$ and $R_{30}$, resistors of comparatively small resistance $R_{27}$ and $R_{28}$ connected to the bases of the transistors and serving to stabilize the circuit operation, emitter resistors $R_{32}$ and $R_{33}$, and a constant-current transistor $Q_{38}$.

In the differential amplifier circuit 12, the constant-current transistor $Q_{38}$ limits by its collector current the quantity of voltage drop across the load resistor $R_{29}$ or $R_{30}$ connected through the differential amplifier transistor $Q_{36}$ or $Q_{37}$. As a result, the differential amplifier transistor $Q_{36}$ or $Q_{37}$ has its collector potential made higher than its base potential and operates in the non-saturated state.

The differential amplifier circuit 12 receives the signal shown in FIG. 2H, and delivers a signal shown in FIG. 2I to an output terminal I.

In this embodiment, the collector of the transistor $Q_{37}$ of the differential amplifier circuit 12 is especially connected through the load resistor $R_{30}$ to that output terminal a of the constant-voltage circuit 14 which provides the voltage $V_{CC1}$ still higher than the voltages $V_{CC2}$ and $V_{CC3}$. Therefore, the resistance of the load resistor $R_{30}$ can be selected so as to operate the transistor $Q_{37}$ in the non-saturated state, and the amplitude of the output signal at the output terminal I can be made large. This makes it possible to easily supply a desired voltage to a circuit 15 which utilizes the detector circuit. Furthermore, this optimizes the operating condition of the transistor $Q_{36}$. More specifically, since the collector output voltage (the voltage at the terminal E) of the transistor $Q_{36}$ having the time constant circuit 10 as its input citcuit may be a small voltage enough to drive a positive feedback circuit (for example, 1/10 of the voltage at the terminal I), the transistor $Q_{36}$ can be operated in a sufficiently unsaturated state. As a result, even when the base input voltage of the transistor $Q_{36}$ becomes high in the transient state at the turn-on of the transistor $Q_{36}$, it does not rise above the collector voltage of the transistor $Q_{36}$ and does not bring the transistor $Q_{36}$ into saturated operation.

In this manner, it is very effective to derive the output voltage from the transistor $Q_{37}$ opposite to the transistor $Q_{36}$ having the time constant circuit 10 as its input circuit.

In the bias supplying circuit 9, a capacitor $C_2$ which is disposed between a terminal $P_8$ and an earth point of the circuit serves for smoothing.

In the arrangement described above, on the basis of the rise of the trigger signal shown in FIG. 2D which is applied to the base of the transistor $Q_{10}$ of the signal combining circuit 4, the input signal of the time constant circuit 10 falls at a time $t_0$, and the output signal thereof falls upon the decay of this input signal.

Owing to the output signal of the time constant circuit 10, the base potential of the transistor $Q_{36}$ of the differential amplifier circuit becomes lower than the base potential of the transistor $Q_{37}$, so that the transistor $Q_{36}$ changes from the "on" state to the "off" state and the transistor $Q_{37}$ from the "off" state to the "on" state. Accordingly, the collector potential of the transistor $Q_{36}$ becomes the high level. The potential of this high level is supplied to the combining circuit 4. In consequence of a feedback through the circuits 4, 6 and 8, the input signal of the time constant circuit 10 remains at the low level as long as the transistor $Q_{36}$ of the differential amplifier circuit 12 is in the "off" state.

The capacitor $C_3$ of the time constant circuit 10 is charged through the resistor $R_{26}$ from the constant-voltage circuit 14. Therefore, the potential of the output terminal of the time constant circuit 10 increases as shown in FIG. 2H according to a time constant thereof.

The base potential of the transistor $Q_{36}$ of the differential amplifier circuit 12 exceeds the base potential of the transistor $Q_{37}$ at a time $t_3$ owing to the output potential of the time constant circuit 10.

As a result, the transistor $Q_{36}$ returns to the "on" state again. Upon the increase of the collector potential of the transistor $Q_{36}$, the input signal of the time constant circuit 10 rises at a time $t_4$ through the circuits 4, 6 and 8.

Upon the rise of the input signal of the time constant circuit 10, the output signal thereof rises. In this case, the output signal is limited by the transistor $Q_{35}$ because the base-emitter path of the transistor $Q_{35}$ of the differentiator output clamp circuit 11 is forward-biased by this signal. Since the emitter terminal of the transistor $Q_{35}$ comes to exhibit a sufficiently low impedance, charges stored in the capacitor $C_3$ of the time constant circuit 10 are rapidly discharged through the transistor $Q_{35}$.

The monostable multivibrator circuit consisting of the circuits 4 to 12 conducts the same operation as above described in response to the next trigger signal.

In the circuit of FIG. 1, the monostable multivibrator circuit provides a pulse signal of a fixed duration as indicated in FIG. 2I every period of the FM signal shown in FIG. 2A.

This signal is impressed on the terminal $P_4$ and the low-pass filter circuit 15. A demodulated signal is obtained from the low-pass filter circuit 15. The demodulated signal is amplified by an amplifier circuit 16.

In this embodiment, the trigger signal and the feedback signal are combined through the pair of emitter-follower transistors (one equivalent transistor consisting of the transistors $Q_{10}$ and $Q_{11}$, and the other equivalent transistor consisting of the transistors $Q_{12}$ and $Q_{13}$), so that the electrical interference between the feedback signal terminal E and the trigger signal terminal D decreases to a negligible extent. Since the trigger terminal receives only the signal from the buffer amplifier circuit 3 and this signal does not undergo any level change due to the interference, the signal stably triggers the monostable multivibrator even in a different trigger period. The feedback terminal E receives only the signal from the differential amplifier circuit 12, and this signal is not interfered with from the trigger terminal etc. Accordingly, the differential amplifier circuit 12 does not cause any distortion ascribable to the interference of the trigger signal.

In contrast, in case where, for example, the trigger terminal is interfered with by the feedback terminal, the level of the trigger terminal is at the high level during the period during which the level of the feedback terminal is at the high level, and it attains the low level when the feedback terminal has attained the low level. In this case, the change of the signal at the trigger terminal is limited by a stray capacitance $C_{01}$ of this trigger terminal, i.e., the output terminal of the buffer amplifier circuit, and hence, the signal level having appeared at the trigger terminal on account of the interference does not immediately decrease. As a result, when the trigger signal period differs, the trigger level changes because the signal level having been caused at the trigger terminal by the interference differs.

In this embodiment according to the invention, the interference with the feedback terminal by the trigger terminal is diminished by the combining circuit as described previously. As illustrated in FIG. 1, the output terminal of the monostable multivibrator circuit is connected to the collector of the differential transistor $Q_{37}$, and it is separated from the feedback terminal. Accordingly, the trigger signal does not leak to the output terminal through the feedback terminal.

The emitter follower transistors of the combining circuit 4 have sufficiently low output impedances, and can accordingly make the rising rate of the composite signal sufficiently high. In case where the trigger terminal and the feedback terminal are directly connected, stray capacitances $C_{01}$ to $C_{03}$ including the collector capacitances of the transistors $Q_3$, $Q_{15}$ and $Q_{36}$, etc. will be combined at the direct connection point and will give a comparatively large value. The emitter follower transistors of the combining circuit 4 make the capacitances independent of one another. Therefore, the respective capacitances of the trigger terminal and the feedback terminal remain small, and the signal changes at these terminals can be made sufficiently rapid.

While this invention has been described above in conjunction with one embodiment, various modifications are possible within a scope not departing from the spirit of the invention.

What is claimed is:

1. A monostable multivibrator circuit including a time constant circuit which includes a capacitor, an amplifier circuit which receives an output signal of the time constant circuit, a positive feedback circuit which is connected between an output end of the amplifier circuit and an input end of the time constant circuit, and trigger circuit means for applying a trigger signal and coupled to a circuit loop constructed of the time constant circuit, the amplifier circuit and the positive feedback circuit, characterized in that said trigger circuit means comprises:
    a pair of transistors means;
    impedance means connected to emitters of said pair of transistors means in common;
    a trigger input terminal for applying the trigger signal and connected to a base of one of said pair of transistors means;
    a feedback input terminal for receiving a feedback signal from said amplifier circuit and connected to a base of the other of said pair of transistors means; and
    an output terminal coupled with said impedance means and coupled with an input end of said positive feedback circuit.

2. A monostable multivibrator circuit according to claim 1, including circuit means for operating said pair of transistors means of said trigger circuit means in a non-saturated state.

3. A monostable multivibrator circuit according to claim 2, wherein said circuit means comprises means for bestowing a predetermined fixed potential on collectors of said pair of transistors means, and means for clamping levels of said trigger signal and said feedback signal to be respectively applied to said bases of said pair of transistors means, to below the fixed potential.

4. A monostable multivibrator circuit according to claim 1, wherein each of said pair of transistors means consists of a plurality of transistors in a Darlington connection.

5. A monostable multivibrator circuit according to any of claims 1 to 4, wherein said impedance means is a constant-current circuit for supplying a constant current to said emitters of said pair of transistors means.

6. A monostable multivibrator circuit according to any of claims 1 to 4, wherein said trigger signal is made a signal whose period is equal to that of an FM modulation wave signal for demodulation, whereby a pulse signal of a duty ratio corresponding to a carried signal is obtained from said amplifier circuit.

7. A monostable multivibrator circuit according to any of claims 1 to 4, wherein said amplifier circuit is a differential amplifier circuit having a pair of output terminals, one of which is connected to said feedback input terminal of said trigger circuit means and the other of which is connected to an output terminal of said monostable multivibrator circuit.

* * * * *